United States Patent [19]

Reindel

[11] 4,044,303
[45] Aug. 23, 1977

[54] MICROWAVE RADIATION DETECTOR

[76] Inventor: John Reindel, 5352 Via Carancho, San Diego, Calif. 92111

[21] Appl. No.: 630,229

[22] Filed: Nov. 10, 1975

[51] Int. Cl.$^2$ .................. G01R 21/04; G01R 31/02
[52] U.S. Cl. ..................... 324/95; 324/120; 325/67; 343/703
[58] Field of Search ............ 324/120, 95; 329/150, 329/203; 332/29 R; 331/65; 325/67; 343/703

[56] References Cited

U.S. PATENT DOCUMENTS

| 3,064,193 | 11/1962 | Grubb et al. | 324/120 |
|---|---|---|---|
| 3,435,374 | 3/1969 | Whitten | 332/29 R |
| 3,523,257 | 8/1970 | Wachs | 332/29 R |
| 3,919,638 | 11/1975 | Belden, Jr. | 324/95 |

*Primary Examiner*—Rudolph V. Rolinec
*Assistant Examiner*—Ernest F. Karlsen
*Attorney, Agent, or Firm*—R. S. Sciascia; G. J. Rubens; H. Fendelman

[57] ABSTRACT

A microwave or other r.f. radiation detector in which a tunnel diode or other negative resistance device exhibiting the proper I-V (current-voltage) characteristics is biased in the positive resistance region near the voltage point at which the peak current occurs. Microwave or any other r.f. signal is picked up and detected by the tunnel diode such that an oscillation circuit connected thereto is caused to oscillate. The frequency of oscillation varies in accordance with the amplitude of the detected r.f. and is monitored with an earphone and/or a meter.

9 Claims, 4 Drawing Figures

MICROWAVE RADIATION DETECTOR

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

Devices for measurement of microwave power are either thermoelectric or rectifying. Thermoelectric devices operate by allowing the input signal power to heat an electric element that changes resistance with temperature. A delicately balanced electronic bridge circuit detects this change which is applied to a meter after some amplification. The thermoelectric devices are generally complex and require careful calibration in order to detect r.f. power levels as low as −20 DBM. Rectifying devices employ detector diodes which by virtue of their square law response provide a d.c. output with about 0.4 MV/W. The output signal must, therefore, be amplified before it can activate any visual or audio indicators. CW or FM signals are difficult to detect by diode detectors due to amplifier stability requirements. This can be circumvented by pre-modulating the input signal before detection. This technique, however, is also relatively complex and costly. Currently available field intensity meters are likewise very costly.

SUMMARY OF THE INVENTION

The present invention relates to a low cost, hand held battery powered detection device for microwave or other r.f. signals. The detector is useful for checking radiation leakage for microwave power sources such as radar transmitters or microwave ovens. It can also be used as a microwave power monitor or as a field intensity meter. The detector is highly sensitive, having the capability of monitoring radiation levels down to approximately −40 DBM yet does not employ any amplification but instead uses an active tunnel diode blocking oscillator circuit whose frequency of oscillation changes with the received signal amplitude. The signal power level can be read or any current meter and an audible indication can be obtained from the oscillator output pulse signals.

STATEMENT OF THE OBJECTS OF THE INVENTION

Accordingly, it is the primary object of the present invention to disclose a novel, low cost, battery powered r.f. detection device.

It is a further object of the present invention to disclose an r.f. device that is highly sensitive but does not employ any amplification.

Other objects, advantages and novel features of the invention will become apparent from the following detailed description of the invention when considered in conjunction with the accompanying drawings.

BRIEF DESCRIPTION OF THE DRAWINGS

FIG. 3a is a top view of a printed circuit implementation of the present invention.

FIG. 3b is a bottom view of the printed circuit of FIG. 3a.

DESCRIPTION OF THE PREFERRED EMBODIMENT

Figure 1:
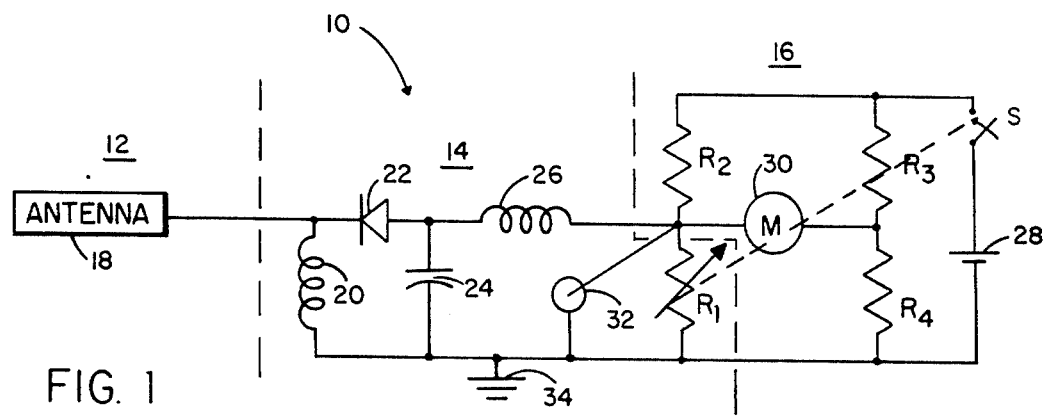
FIG. 1 is a schematic circuit diagram of the detector of the present invention.
Figures 3A, 3B:
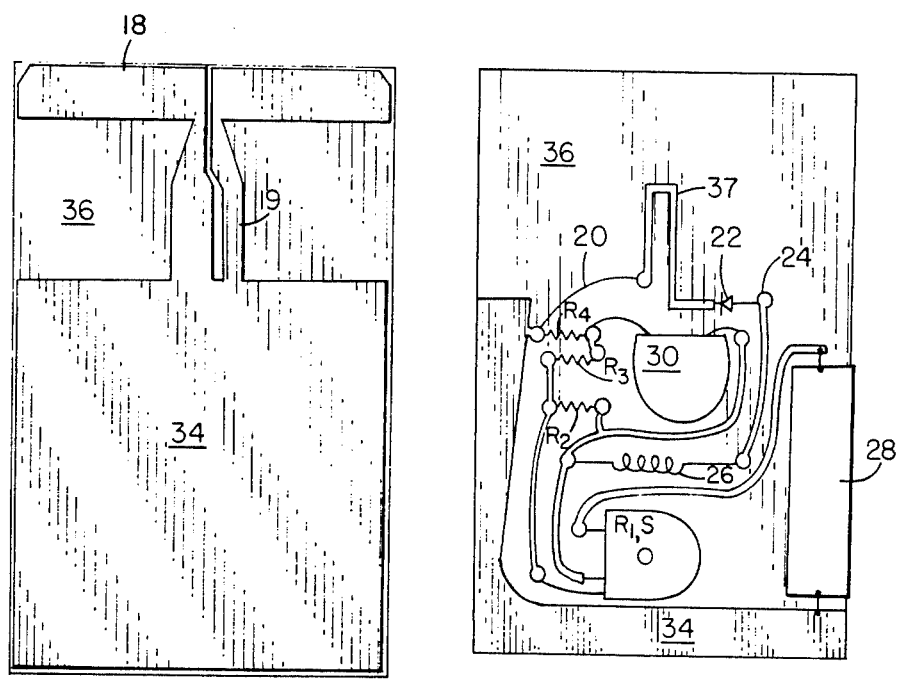

Referring now to FIG. 1, the microwave radiation detector 10 comprises a pick-up section 12, a tunnel diode and oscillator circuit 14, and a power supply and meter circuit 16. The pick-up circuit 12 comprises an antenna 18 which may include a balun for providing a matched transmission from the antenna to the tunnel diode. The balun 19 is illustrated in FIG. 3b in the printed circuit embodiment. The tunnel diode circuit 14 includes an r.f. choke comprised of inductor 20 and also includes tunnel diode 22, capacitor 24, inductor 26 and potentiometer R1. The power supply and monitor circuit 16 includes resistors R2, R3 and R4 and d.c. power supply 28 which may comprise, for example, a 1.5 volt d.c. battery. Current meter 30 is connected at one end thereof between the junction of resistors R1 and R2 and at the other end between the junction of resistors R3 and R4. An earphone and jack 32 may also be connected between the junction of resistors R1 and R2 and ground 34. The printed circuit implementation of the circuit illustrated in FIG. 1 is illustrated in FIGS. 3a and 3b wherein the antenna 18 is pictured as a printed circuit dipole that is matched to the diode circuit with balun 19. It is to be understood, however, that other types of antennas are also suitable. A switch S may also be provided in series with the power supply 28. As is illustrated by the dotted line in FIG. 1, the switch S may be ganged with the potentiometer R1 such that the power supply can be disconnected for conservation thereof. The components are mounted on circuit board 36 and connected as illustrated in FIGS. 3a and 3b. Choke 20, capacitor 24, resistor R1 and resistor R4 as well as power supply 28 have one of their terminals connected to the ground plane 34 which may be provided on both sides of board 36 as illustrated, with a connection between both portions thereof through board 36. The printed circuit board 36 has the antenna printed on both sides. The ground side, FIG. 36, has the dipole 18 and balun 19, and the other side, FIG. 3a, has a half wave open circuit transmission line loop 37 that is connected to the diode 22. A high impedance quarter wave line connected from 37 to ground serves as the r.f. choke 20.

Figure 2:
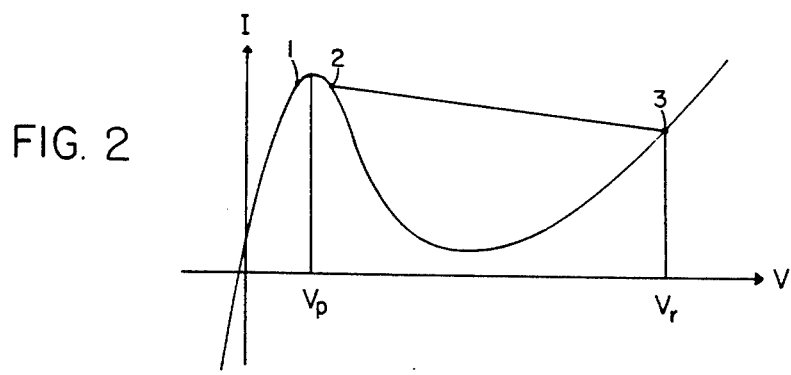
FIG. 2 is a graph of the I-V characteristic of the tunnel diode or other negative resistance device used in the present invention.

The choke 20 provides a d.c. return for the diode bias circuit and shorts out the antenna 18 at low frequencies such that antenna 18 is not responsive to low level electric noise. The value of capacitor 24 is selected to provide a short circuit at r.f. frequencies but an open circuit at audio (approximately 5kc) frequencies. The non-linear I-V characteristics of the tunnel diode 22 are illustrated in the graph of FIG. 2. The detector diode 22 serves two functions. It detects the incoming r.f. signals and thereby raises the voltage across capacitor 24 and it also provides a negative resistance that is used to make the circuit 14 oscillate. The diode 22 rectifies the input r.f. signals and charges capacitor 24. Resistors R2 and R1 are selected to set the voltage bias of tunnel diode 22 at point 1, just below the voltage $V_p$ at which the peak current occurs as illustrated in FIG. 2, such that the diode resistance is positive and thereby preventing oscillation of circuit 14. When an r.f. signal is picked up by the antenna 18 and detected by the diode 22, the voltage rises first to $V_p$ or beyond to point 2 and then by virtue of the negative resistance, increases to $V_r$ indicated as point 3 in FIG. 2 as capacitor 24 is charged up. The circuit comprised of resistor R1, inductor 26, capacitor 24 and the tunnel diode 22 will then continuously oscillate by switching states between points 2 and 3 and produces pulses of amplitude $(V_r-V_p)$ at a rate determined by the values of inductor 26 and the resistance of variable resistor R1 as well as the amplitude of the detected r.f. signal. As the amplitude of the r.f. signal increases, the operating point 2 is pushed further down the slope of the I-V curve in the negative resistance region and the relaxation pulse rate increases. Typically, the oscillator frequency can vary from 10kc to 1000kc as the input r.f. power is increased from −40DBM to −15DBM. The relaxation oscillation frequency can be selected by varying the value of inductor 26. The threshold of the detector can be adjusted by adjusting potentiometer R1 from about −45DBM to −10DBM. Thus, the d.c. level of the incoming r.f. is passed to the oscillator circuit 14 whereas the r.f. frequencies are filtered by capacitor 24. By this arrangement, as the d.c. level of the incoming r.f. changes, the frequency of oscillation of circuit 14 also varies, the oscillator 14 increasing its frequency as the amplitude of the incoming r.f. increases.

Meter 30 indicates the rms value of the diode 22 operating points. Resistors R3 and R4 are selected such that the meter at threshold (operating point 1) reads 0 or is vibrating at a subaudio rate at the zero point. The pulsed output of oscillator 14 can also be taken at the junction of resistors R1 and R2 by providing jack and earphone 32 connected therebetween and at ground to obtain an audible indication of the input r.f. power. The tone indicated by the earphone will thus increase as the amplitude of the incoming r.f. increases.

Thus, a simple low cost device for detecting and indicating microwave radiation has been disclosed. The detector circuit is highly efficient and very low levels of r.f. power can activate the device and give both a visible indication on a meter or an audio indication by applying the pulse signals to an earphone. The meter can be calibrated to indicate power levels from −45 to −15DBM directly. By attenuating the input power with lossy hoods over the antenna or by shunting the diode with calibrated resistors it is feasible to extend the range of detected r.f. power upwards. The antenna illustrated in FIG. 3 is an illustration of an antenna designed for the frequency of the commercial microwave ovens (2450MHz). The antenna size can be adjusted, however, for any desired frequency band. Alternately, the antenna can be made for very broadband operation by using probe or spiral type antenna designs.

Obviously many modifications and variations of the present invention are possible in the light of the above teachings. It is therefore to be understood that within the scope of the appended claims the invention may be practiced otherwise than as specifically described.

What is claimed is:

1. A microwave radiation detector comprising:
   first means for receiving r.f. signals;
   a negative resistance device connected to said first means and having an I-V characteristic including a positive resistance operating region and a negative resistance operating region and a point of peak current therebetween;
   an oscillation network connected to said negative resistance device;
   bias supply means connected to said oscillation network and to ground for biasing said negative resistance device in said positive resistance operating region when no r.f. signal has been received by said first means, the output of said first means biasing said negative resistance device at least temporarily into said negative resistance operating region; and
   sensing means connected to said oscillation network for indicating the amplitude of said r.f. signals.

2. The detector of claim 1 including a two terminal r.f. choke having one terminal thereof connected between said first means and said negative resistance device and the other terminal thereof connected directly to ground, said r.f. choke providing a d.c. return path for said bias supply means.

3. The detector of claim 2 wherein said negative resistance device is a tunnel diode.

4. The detector of claim 3 wherein said oscillation network comprises:
   a capacitor having first and second terminals, said first terminal being connected to said tunnel diode and said second terminal being connected to ground;
   said capacitor acting as a short circuit to r.f. signals and as an open circuit to audio frequency signals; and
   an inductor having first and second terminals, said first inductor terminal being connected to said capacitor first terminal and said second inductor terminal being connected to said bias supply means.

5. The detector of claim 4 wherein said oscillation network further comprises a variable resistor connected between said inductor second terminal and ground.

6. The detector of claim 5 wherein said bias supply means biases said tunnel diode in said positive resistance region just below said point of peak current.

7. The detector of claim 6 wherein said bias supply means comprises:
   a d.c. voltage supply;
   first and second resistors connected in series with said d.c. voltage supply; and
   a third resistor connected between said variable resistor and said first resistor.

8. The detector of claim 7 wherein said sensing means comprises a meter connected between the junction of said first and second resistors and the junction of said third resistor and said variable resistor.

9. The detector of claim 8 wherein said sensing means further comprises an earphone connected between ground and the junction of said third resistor and said variable resistor.

* * * * *